United States Patent
Chen

(10) Patent No.: US 7,311,529 B2
(45) Date of Patent: Dec. 25, 2007

(54) ELECTRONIC DEVICE WITH EMI SHIELD

(75) Inventor: Hsuan-Chen Chen, Tu-cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/374,787

(22) Filed: Mar. 13, 2006

(65) Prior Publication Data

US 2006/0234552 A1   Oct. 19, 2006

(30) Foreign Application Priority Data

Apr. 15, 2005   (CN) .................. 2005 2 0057326

(51) Int. Cl.
    *H01R 12/00*   (2006.01)
(52) U.S. Cl. ..................... 439/76.1; 439/377
(58) Field of Classification Search ............... 439/607, 439/608, 76.1
    See application file for complete search history.

(56) References Cited

U.S. PATENT DOCUMENTS

| | | | | |
|---|---|---|---|---|
| 4,821,150 A | * | 4/1989 | Duthie et al. ............... 361/736 |
| 5,712,765 A | * | 1/1998 | Lehrmann et al. ........... 361/704 |
| 5,797,771 A | * | 8/1998 | Garside ...................... 439/610 |
| 5,836,774 A | * | 11/1998 | Tan et al. ................... 439/76.1 |
| 6,109,969 A | * | 8/2000 | Kuo et al. ................... 439/610 |
| 6,139,365 A | * | 10/2000 | Lok ............................ 439/607 |
| 6,165,017 A | * | 12/2000 | Kuo ............................ 439/610 |
| 6,275,390 B1 | | 8/2001 | Wu et al. |
| 6,328,588 B1 | * | 12/2001 | Tsai et al. ................... 439/352 |
| 6,413,112 B2 | * | 7/2002 | Semmeling et al. ........ 439/358 |
| 6,666,720 B1 | * | 12/2003 | Reisinger et al. ........... 439/607 |
| 6,776,658 B2 | * | 8/2004 | Tang .......................... 439/607 |
| 6,859,371 B2 | | 2/2005 | Huang |
| 6,862,181 B1 | | 3/2005 | Smith et al. |
| 6,865,369 B2 | * | 3/2005 | Semmeling et al. ........ 434/357 |
| 6,953,361 B2 | * | 10/2005 | Li et al. ..................... 439/358 |
| 6,976,876 B1 | * | 12/2005 | Su et al. ..................... 439/607 |
| 2004/0029444 A1 | * | 2/2004 | Tang .......................... 439/607 |

\* cited by examiner

*Primary Examiner*—Neil Abrams
*Assistant Examiner*—Harshad C Patel
(74) *Attorney, Agent, or Firm*—Morris Manning Martin LLP; Tim Tingkang Xia, Esq.

(57) ABSTRACT

An electronic device includes an enclosure, a circuit board, and an EMI shield. The EMI shield includes a cover plate, and a pair of side plates extending from two opposite sides of the cover plate. Two slide rails are formed in the side plates for receiving corresponding sides of the circuit board to slide therealong. The EMI shield is received in the enclosure.

8 Claims, 4 Drawing Sheets

ELECTRONIC DEVICE WITH EMI SHIELD

BACKGROUND OF THE INVENTION

1. Field of the Invention

The present invention relates to Electromagnetic Interference (EMI) shields, and particularly to an EMI shield which can reduce EMI from a circuit board of an electronic device.

2. Background of the Invention

In the enclosure of a typical electronic device, there are generally kinds of electronic components such as Central Processing Units (CPUs) and accelerated chips mounted in a circuit board of the enclosure. The electronic components may emit electromagnetic radiation as operating. The EMI may has a great influence on other components mounted in the enclosure and even may lead to abnormal work of the components.

Additionally, an EMI shield is mounted to the circuit board by fixing means, such as welding, screws, and so on. While a component in the circuit board is damaged, the EMI shield should be removed from the circuit board. Thus, the component can be repaired or be replaced. Meanwhile, the EMI shield is not easy to be removed from the circuit board. The circuit board may be damaged while removing the EMI shield.

What is needed is to provide an EMI shield to reduce EMI from a circuit board of an electronic device.

SUMMARY

An exemplary electronic device includes an enclosure, a circuit board, and an EMI shield. The EMI shield includes a cover plate, and a pair of side plates extending from two opposite sides of the cover plate. Two slideways are formed in the side plates for receiving corresponding sides of the circuit board to slide therealong. The EMI shield is received in the enclosure.

Other advantages and novel features of the invention will become more apparent from the following detailed description when taken in conjunction with the accompanying drawings, in which:

DETAILED DESCRIPTION OF THE EMBODIMENT

Figure 1:
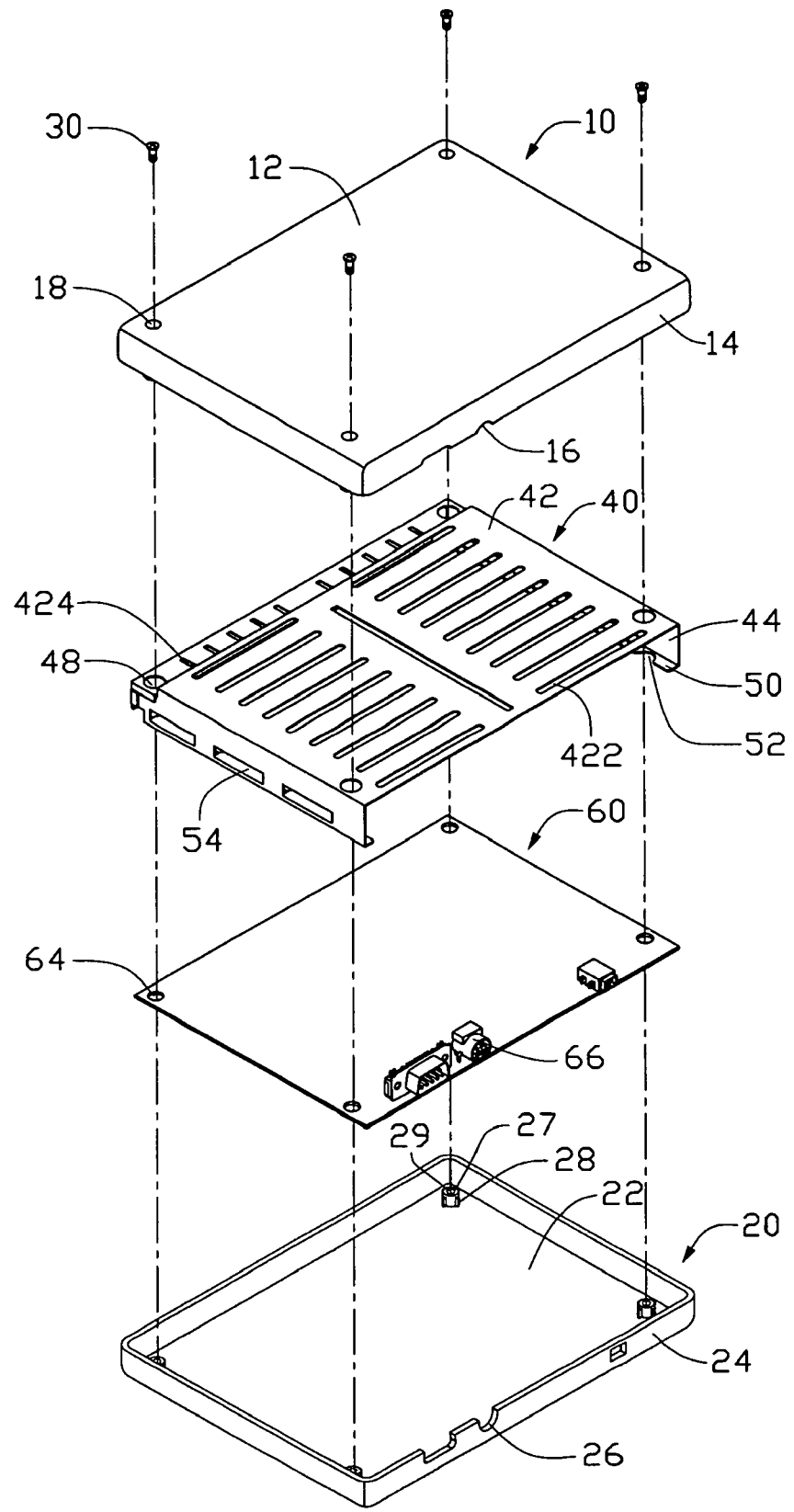
FIG. 1 is an exploded, isometric view of an electronic device with an EMI shield in accordance with a preferred embodiment of the present invention.

Referring to FIG. 1, an electronic device in accordance with a preferred embodiment of the present invention includes an enclosure, an EMI shield 40, and a board-like circuit component 60.

The enclosure includes a top cover 10, a bottom cover 20, and a plurality of fixing means 30. The top cover 10 includes a top panel 12 and four flanges 14 extending downwardly from four edges of the top panel 12. A plurality of first breaches 16 is defined in a bottom of one of the flanges 14. Four first fixing poles 15 (see FIG. 3) protrude downwardly from four corners of the top panel 12. A T-shaped securing hole 18 is defined in each fixing pole 15. The bottom cover 20 includes a bottom panel 22 and four flanges 24 extending upwardly from four edges of the bottom panel 22. A plurality of second breaches 26 is defined in a top of one of the flanges 24. Four second fixing poles 27 protrude upwardly from four corners of the bottom panel 24. A plurality of support members 28 protrudes from a circumference of each second fixing pole 27. Tops of the second fixing poles 27 are higher than tops of the corresponding support members 28. A screw hole 29 is defined in each second fixing pole 27.

The EMI shield 40 is made of conducting material. The EMI shield 40 includes a cover plate 42, a pair of side plates 44 extending downwardly from two opposite sides of the cover plate 42, and a rear plate 46 (see FIG. 3) extending downwardly from a rear side of the cover plate 42. The cover plate 42, the side plates 44 and the rear plate 46 form a space for receiving the circuit board 60. A plurality of regulated notches 422, 424 is defined in the cover plate 42 for heat dissipation. An orientation hole 48 is defined in each corner of the cover plate 42, corresponding to a corresponding through hole 18 of the top cover 10. A first projecting member like a support plate 50 is bent perpendicularly inwardly from a bottom of each side plate 44 of the EMI shield 40. Two semicircular avoiding cutouts 52 are defined in each support plate 50. A second projecting member like a plurality of tabs 54 is stamped perpendicularly and inwardly from each side plate 44. A slot acting as a slideway is therefore formed between each support plate 50 and the corresponding tabs 54, for confinably grasping and receiving a corresponding side of the circuit board 60.

The circuit board 60 defines four fixing holes 64 in four corners thereof. A diameter of each fixing hole 64 is smaller than that of the corresponding first fixing pole 15 of the top cover 10, but larger than that of the corresponding second fixing pole 27 of the bottom cover 20. A plurality of input/output ports 66 is mounted on a side of the circuit board 60.

Figure 2:
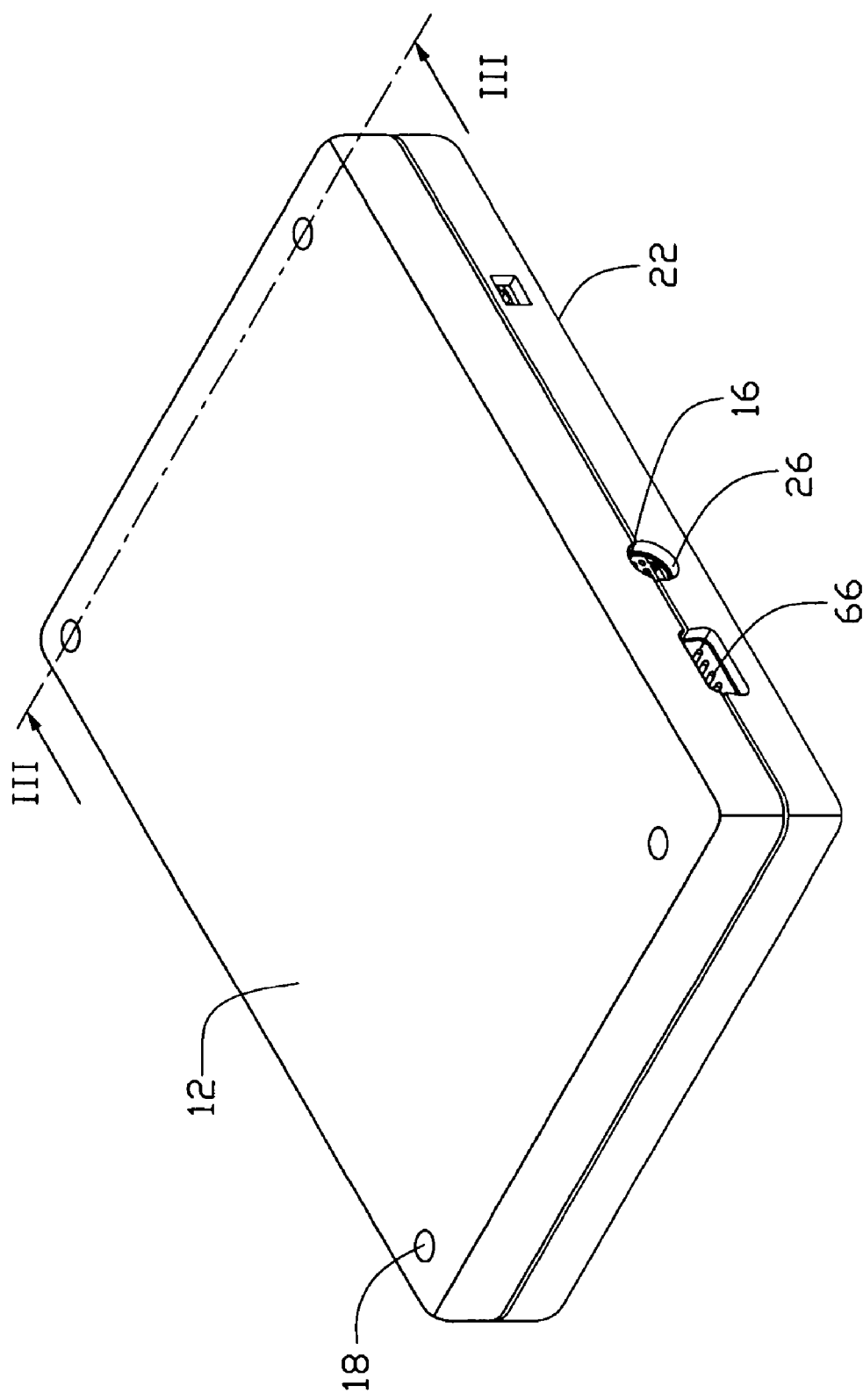
FIG. 2 is an assembled view of FIG. 1.
Figure 3:
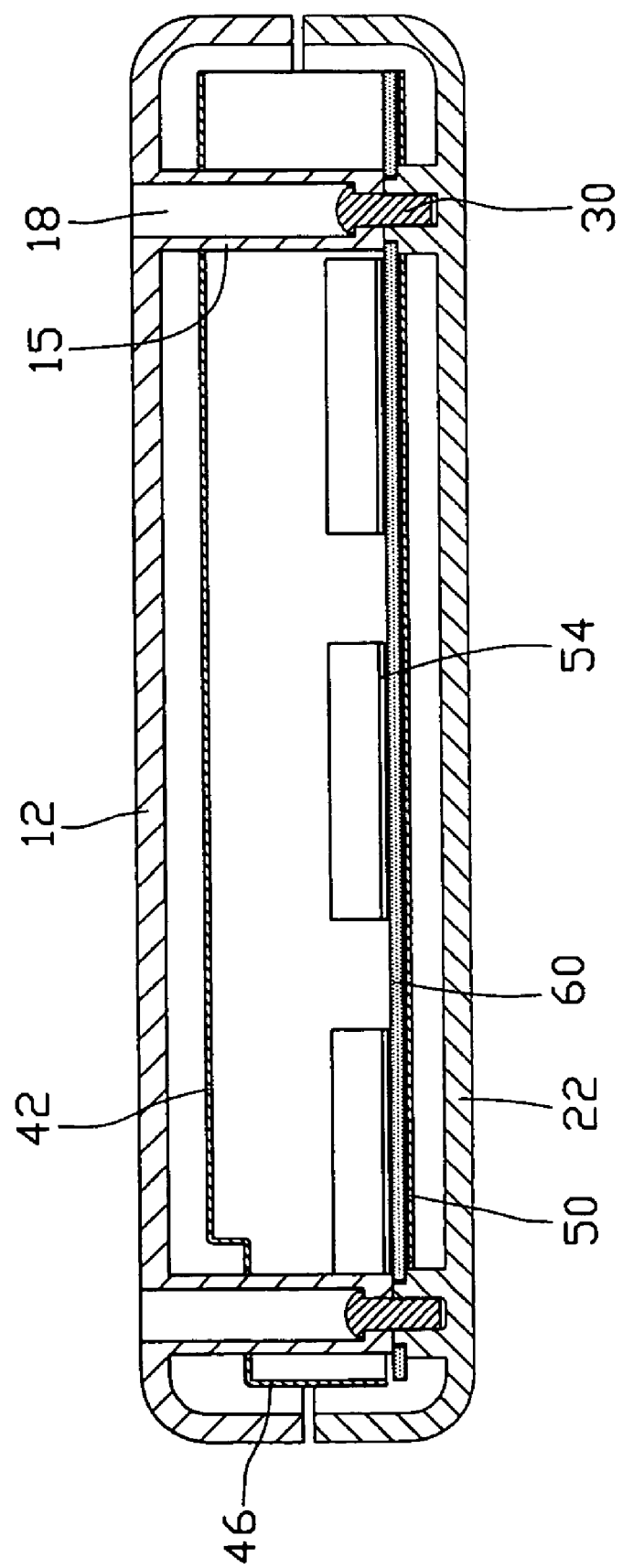
FIG. 3 is a cross-sectional view taken along line III-III of FIG. 2.

Referring also to FIGS. 2 and 3, in assembly, the circuit board 60 is pushed into the EMI shield 40 from a side opposite to the rear plate 46, and slides along the slideways of the EMI shield 40. The fixing holes 64 of the circuit board 60 align with the corresponding orientation holes 48 of the EMI shield 40. The circuit board 60 together with the EMI shield 40 are placed on the corresponding support members 28 of the bottom cover 20 with the tops of the second fixing poles 27 being received in the corresponding fixing holes 64 of the circuit board 60. The top cover 10 is placed on the EMI shield 40 with the first fixing poles 15 traversing the corresponding orientation holes 48 of the EMI shield 40. The securing holes 18 of the top cover 10 align with the corresponding fixing holes 64 of the circuit board 60 and the corresponding screw holes 29 of the bottom cover 20. The fixing means 30 are inserted into the corresponding securing holes 18 of the top cover 10, and engaged in the corresponding screw holes 29 of the bottom cover 20. Each first breach 16 of the top cover 10 and a corresponding second breach 26 of the bottom cover 20 together form a through hole for exposing a corresponding input/output port 66. Thus, the assembly is complete.

Figure 4:
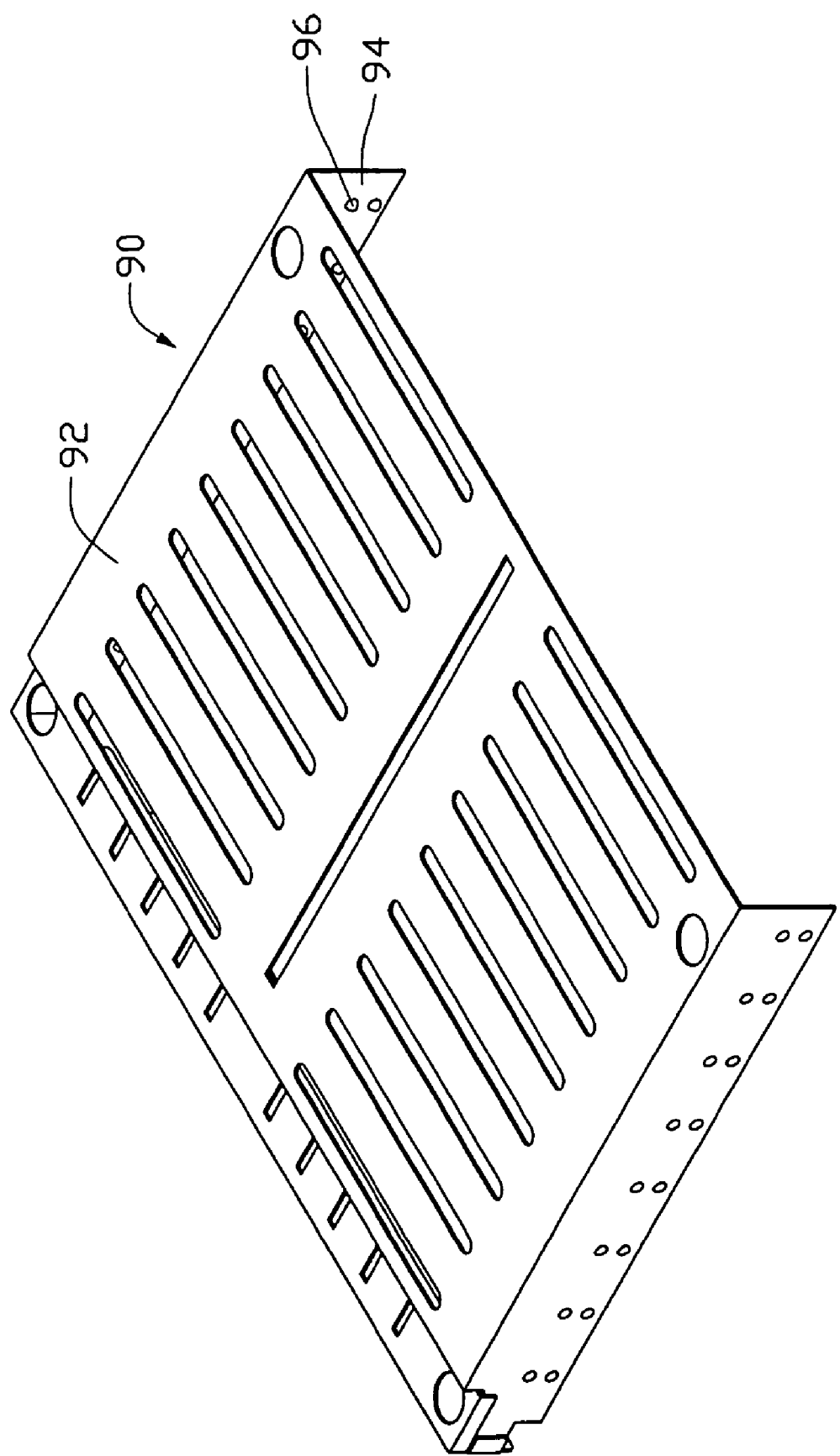
FIG. 4 is an isometric view of an EMI shield in accordance with an alternative embodiment of the present invention.

FIG. 4 shows an EMI shield 90 in accordance with the alternative embodiment of the present invention. The EMI shield 90 includes a cover plate 92 and a pair of side plates 94 extending downwardly from two opposite sides of the cover plate 92. Two rows of protrusions 96 protrude inwardly from each side plate 94. A slideway is formed between the corresponding two rows of protrusions 96 of each side plate 94. The circuit board 60 can slide along the Aide-fails slideways of the EMI shield 90.

It is believed that the present embodiment and its advantages will be understood from the foregoing description, and it will be apparent that various changes may be made thereto without departing from the spirit and scope of the invention or sacrificing all of its material advantages, the example hereinbefore described merely being preferred or exemplary embodiment of the invention.

I claim:

1. An EMI (Electromagnetic Interference) shield comprising:
   a cover plate; and
   a pair of side plates extending from two opposite sides of the cover plate, a first member and a second member, wherein the second member is parallel and lower to the first member formed from each of the side plates, a slideway formed between the first and second members of each of the side plates adapted for confinably receiving a corresponding side of a circuit board to slide therein, the second member configured for supporting the corresponding side of the circuit board thereon; wherein
   the first and second members comprise two parallel rows of salient points protruding inwardly from each of the side plates, a lower row of the salient points is configured for supporting a corresponding side of the circuit board thereon.

2. The EMI shield as claimed in claim 1, wherein a plurality of regulated notches is defined in the cover plate for heat dissipation.

3. The EMI shield as claimed in claim 1, further comprising a rear plate extending downwardly from a rear side of the cover plate.

4. An electronic device comprising:
   an enclosure;
   a circuit board; and
   an EMI (Electromagnetic Interference) shield comprising a cover plate, and a pair of side plates extending from two opposite sides of the cover plate, a first projecting member and a second projecting member spaced from the first projecting member protruding from each of the side plates, the second projecting member parallel to and lower to the first projecting member, a slideway formed at each of the side plates between the first projecting member and the second projecting member, for receiving a corresponding side of the circuit board to slide therealong, the second projecting member configured for supporting the corresponding side of the circuit board, the EMI shield received in the enclosure;
   wherein the enclosure comprises a top cover and a bottom cover, the circuit board and the EMI shield are mounted between the top cover and the bottom cover; and
   wherein the first and second projecting members comprise two rows of salient points protruding inwardly from each of the side plates, the slideways are formed between the corresponding two rows of protrusions of the side plates, a lower one row of the protrusions is configured for supporting the corresponding side of the circuit board thereon.

5. The electronic device as claimed in claim 4, wherein the top cover comprises a top panel and a plurality of flanges extending downwardly from edges of the top panel, the bottom cover comprises a bottom panel and a plurality of flanges extending upwardly from edges of the bottom panel.

6. The electronic device as claimed in claim 5, wherein a first breach is defined in a bottom of one of the flanges of the top cover, a second breach is defined in a top of one of the flanges of the bottom cover, an input/output port is mounted on a side of the circuit board, the first breach and the second breach form a through hole for the input/output port.

7. The electronic device as claimed in claim 4, wherein a plurality of regulated notches is defined in the cover plate for heat dissipation.

8. The electronic device as claimed in claim 4, wherein the EMI shield further comprises a rear plate extending downwardly from a rear side of the cover plate.

* * * * *